United States Patent [19]

Ikushima

[11] Patent Number: 5,360,146
[45] Date of Patent: Nov. 1, 1994

[54] LIQUID DISPENSER PLUNGER

[75] Inventor: Kazumasa Ikushima, Tokyo, Japan

[73] Assignee: Musashi Engineering Inc., Tokyo, Japan

[21] Appl. No.: 6,730

[22] Filed: Jan. 21, 1993

[30] Foreign Application Priority Data

Jan. 23, 1992 [JP] Japan .................................. 4-010277

[51] Int. Cl.⁵ .............................................. B67D 5/42
[52] U.S. Cl. ..................................... 222/386; 222/326
[58] Field of Search ........ 222/386, 389, 387, 325–327; 604/218, 230, 231, 222

[56] References Cited

U.S. PATENT DOCUMENTS

| | | | |
|---|---|---|---|
| 2,661,126 | 12/1953 | Spencer | 222/386 |
| 3,870,200 | 3/1975 | Spatz | 222/386 X |
| 4,247,023 | 1/1981 | Shew | 222/386 |
| 4,671,432 | 6/1987 | Benecke et al. | 222/386 |
| 4,792,065 | 12/1988 | Soehnlein et al. | 222/386 X |
| 4,840,293 | 6/1989 | Segatz | 222/386 X |
| 4,854,485 | 8/1989 | Collins | 222/386 |
| 4,913,323 | 4/1990 | Scheindel | 222/386 |
| 4,966,468 | 10/1990 | Brüning | 222/386 X |
| 5,042,696 | 8/1991 | Williams | 222/386 X |
| 5,111,973 | 5/1992 | Mueller | 222/386 |
| 5,127,556 | 7/1992 | Sporri | 222/386 X |

Primary Examiner—Andres Kashnikow
Assistant Examiner—Kenneth DeRosa
Attorney, Agent, or Firm—Dvorak and Traub

[57] ABSTRACT

A liquid dispenser for a viscous liquid includes a hollow cylinder and a plunger axially slidably accommodated within the cylinder. The plunger has a tapered front section with an outer diameter at its rear end which is slightly smaller than the cylinder inner diameter, a drum-like intermediate section with a reduced outer diameter, and a cylindrical rear section with a maximum outer diameter which is slightly greater than the cylinder inner diameter, wherein these sections are axially aligned with, and connected to each other. The rear section has a plurality of resiliently deformable flap regions defined by, and between a plurality of axial slits in its outer surface.

7 Claims, 2 Drawing Sheets

LIQUID DISPENSER PLUNGER

BACKGROUND OF THE INVENTION

1. Field of the Invention

The present invention relates to a liquid dispenser including a hollow cylinder to be filled by a viscous liquid, whereby a predetermined constant quantity of the viscous liquid can be discharged from the front end of the cylinder.

2. Description of the Prior Art

This type of liquid dispenser, often called as a "syringe", is used to repeatedly discharge with high frequency a predetermined small quantity of viscous liquid by which the cylinder is filled, such as paste- or cream-like electronic materials, adhesive agents, etc. The cylinder is generally composed of a transparent material, and is filled by the viscous liquid and supplied with a pressurized air pulse in use so that the liquid is to be uniformly urged by the pressurized air and discharged through a needle at the front end of the cylinder. In this instance, the liquid level within the cylinder is lowered each time the liquid is discharged through the needle.

Specifically in the case of a liquid with a high viscosity, there arises a problem that the liquid tends to be attached onto the inner wall of the cylinder and the liquid level at the center region of the cylinder is lowered by an increased amount as compared to the peripheral region. In the worst situation, when the depth of the liquid at the center region of the cylinder becomes extremely small, the pressurized air also may be discharged through the needle without properly urging the liquid, making it difficult or practically impossible to discharge a desired constant quantity of the viscous liquid.

This problem is particularly significant when the dispenser is used to discharge an opaque viscous liquid. That is, when the liquid is maintained attached to the inner wall of a transparent cylinder, the lowered liquid level at the center region of the cylinder cannot be visually observed from outside through the cylinder. Thus, the discharge of the viscous liquid may be continued without realizing that the pressurized air also is being discharged.

Heretofore, various proposals have been made in an attempt to avoid the discharge of the pressurized air and ensure a satisfactory discharge of the viscous liquid alone. One approach generally adopted in this respect is to accommodate a plunger within the cylinder, which is applied with a pressurized air pulse and undergoes an axial sliding displacement within the cylinder for uniformly urging the viscous liquid filling the space defined by the cylinder and the plunger.

Various examples of the liquid dispenser incorporating such a plunger will be explained below with particular reference to FIGS. 1A to 1D.

A basic example of the liquid dispenser shown in FIG. 1A includes a cylinder 1 in which a plunger 2 is simply axially slidably accommodated in the cylinder 1, for discharging a viscous liquid 3 within a space defined by the cylinder 1 and the plunger 2. The plunger 2 has an outer diameter which is made slightly smaller than the inner diameter of the cylinder 1. When the viscous liquid 3 contains solid matters, as is the case in cream-like soldering materials, such solid matters tend to be squashed or jammed into an annular clearance between the cylinder 1 and the plunger 2 to impede a smooth operation of the plunger 2. Thus, it is still difficult to satisfactorily achieve the intended discharge of the constant quantity of the viscous liquid 3.

When the plunger 2 has an outer diameter which is substantially smaller than the inner diameter of the cylinder 1, as shown in FIG. 1B, the solid matters in the viscous liquid 3 can be prevented from being jammed into the annular clearance between the cylinder 1 and the plunger 2. However, because an increased amount of the viscous liquid 3 is admitted into the annular clearance in a relatively unrestricted sense, the plunger 2 may be dipped into the liquid 3. Therefore, it is not only difficult for the plunger 2 to properly achieve the intended functions, but also it becomes impossible to perform a visual observation of the liquid level from outside.

According to another example shown in FIG. 1C, the liquid dispenser incorporates a plunger 4 which is provided with one or more seal rings 5a, 5b made of a resilient material. The seal rings 5a, 5b effectively prevent entry of the viscous liquid 3 into the annular clearance between the cylinder 1 and the plunger 4, although the solid matters contained in the viscous liquid still tend to be jammed into the clearance under a resilient deformation of the seal rings, to impede a smooth operation of the plunger 4. Besides, a frictional resistance occurs between the inner wall of the cylinder 1 and the seal rings 5a, 5b, and makes it difficult properly to displace the plunger 4 by applying the pressurized air pulse to the top surface of the plunger 4.

Still another example is shown in FIG. 1D, wherein the liquid dispenser incorporates a hollow plunger 6 which is provided with a pair of axially spaced flanges 7a, 7b. The plunger 6 has a substantially U-shaped longitudinal section, with an inner peripheral surface and a bottom surface which are applied by a pressurized air pulse as shown at 8, in order to axially displace the plunger 6 downwardly in FIG. 1D, and also to urge the flanges 7a, 7b tightly against the inner surface of the cylinder 1. The flanges 7a, 7b are axially slidably guided by the cylinder 1 so as to effectively achieve the intended functions; i.e., to prevent the viscous liquid 3 from being admitted into the annular clearance between the cylinder 1 and the plunger 6, and also to prevent the solid matters in the viscous liquid 3 from being jammed into the clearance.

In operation of the liquid dispenser of FIG. 1D, the viscous liquid 3 is discharged from the needle (not shown) by applying a pressurized air pulse to the pressure receiving surfaces of the plunger 6. When the constant quantity of the viscous liquid 3 has been discharged from the needle and the supply of the air pulse is subsequently stopped, the restoring force of the viscous liquid which had been in a compressed state tends to push back the plunger 6 away from the needle. On this occasion, as the case may be, a small amount of air is sucked from the top end region of the plunger 6 into the annular clearance between the cylinder 1 and the plunger 6, as shown at 9. Once the air 9 has been sucked into the clearance, it is retained therein without being discharged toward the top end region of the plunger 6. Rather, the amount of air 9 retained in the clearance tends to increase during the repeated operation of the plunger 6. It has to be noted that a similar problem takes place in the example of FIG. 1C, as well.

When a substantial amount of air 9 is retained in the annular clearance between the cylinder 1 and the plunger 4, 6 in the examples of FIGS. 1C and 1D, the pressure of the air pulse applied to the plunger 4, 6 is transmitted to the viscous liquid 3 through the air 9 within the annular clearance, which more or less undergoes a compression during a downward displacement of the plunger 4, 6. Thus, the transmission of the air pressure to the viscous liquid 3 is retarded, with a resultant fluctuation in quantity of the viscous liquid 3 which is actually being discharged from the needle. In the worst case, due to the compression of the air 9 within the annular clearance, the viscous liquid 3 cannot be discharged from the needle at all. This problem is particularly serious in the example of FIG. 1D, wherein the air pressure is also used to urge the flanges 7a, 7b against the inner wall of the cylinder 1.

SUMMARY OF THE INVENTION

It is therefore a principal object of the present invention to provide an improved liquid dispenser for discharging a predetermined constant quantity of the viscous liquid, which is essentially free from the various drawbacks of the prior art as discussed above.

The present invention is to provide an improved liquid dispenser which is capable of:

preventing the viscous liquid from being excessively admitted into the annular clearance between the cylinder and plunger, preventing solid matters contained in the viscous liquid from being jammed into the annular clearance, preventing air from being sucked into the annular clearance from the top end region of the plunger, and ensuring the air pressure to be properly transmitted to the viscous liquid, thereby allowing a stable discharge of a constant quantity of the viscous liquid.

To this end, according to the present invention, there is provided a liquid dispenser for a viscous liquid, including a hollow cylinder having a predetermined inner diameter, and a plunger which is axially slidably accommodated within said cylinder, wherein said plunger comprises: a front section with a front end and a rear end, which is tapered so that its diameter increases toward the rear end where it has an outer diameter which is slightly smaller than the inner diameter of the cylinder; an intermediate section having a reduced diameter and connected to the front section on axially rear side thereof; and a rear section having a maximum outer diameter which is slightly greater than the inner diameter of the cylinder, and connected to the intermediate section on axially rear side thereof, the rear section having a plurality of resiliently deformable flap regions defined by and between a plurality of axial slits in its outer surface.

With the above-mentioned arrangement of the liquid dispenser in accordance with the present invention, during the assembly of the plunger into the cylinder, the front section with a slightly smaller outer diameter at its rear end, and the rear section with a slightly greater maximum outer diameter, both with reference to the inner diameter of the cylinder, are brought into contact with the inner wall of the cylinder to prevent undesired inclination of the plunger axis relative to the cylinder axis, for allowing a proper insertion of the plunger into the cylinder whenever required.

During this insertion, furthermore, the tapered front section of the plunger serves to discharge the viscous liquid and residual air within the cylinder, and also solid matters contained in the liquid as the case may be, toward the rear section through a clearance between the rear end of the front section and the inner wall of the cylinder. Irrespectively of whether the viscous liquid contains solid matters, the viscous liquid urged upwardly of the cylinder can be effectively blocked by the rear section of the plunger which is tightly fitted inside of the cylinder in its elastically deformed state.

Thus, in accordance with the present invention, during the insertion of the plunger and subsequent discharge of the viscous liquid from the dispenser, the liquid can be effectively prevented from attaching to the inner wall of the cylinder due to the tight sliding contact between the cylinder inner wall and the flap regions defined between the axial slits in the outer surface of the rear section of the plunger. This means that the solid matters, which are contained in the viscous liquid as the case may be, can be prevented from being jammed in the annular clearance between the cylinder inner surface and the flap regions of the rear section, to ensure a smooth operation of the plunger. In a strict sense, though, the viscous liquid to some extent may be maintained attached to the cylinder inner wall at its regions corresponding to the axial slits in the rear section of the plunger. Nevertheless, the axial slits can be made to have a minimized width such that the amount of the viscous liquid actually attached to the cylinder inner wall is negligibly small. Thus, the visual observation of the liquid level can be performed from outside, practically without any troubles or difficulties.

Moreover, because the flap regions in the outer surface of the plunger rear section defined between the axial slits are brought into tight contact with the cylinder inner wall in their compressed and radially inwardly deformed state, and serve to effectively compensate for fluctuations in the inner diameter of the cylinder due to manufacturing tolerance or the like.

When the pressurized air pulse is applied to the plunger in use condition of the liquid dispenser, the air pressure serves to urge the viscous liquid mainly indirectly through the plunger and partly directly through the axial slits, to accurately discharge the liquid from the needle at the front end of the cylinder, by a predetermined amount as related to the air pressure level and the pulse length of the pressurized air pulse.

During the discharge process, even when the solid matters contained in the viscous liquid may reach the flap regions of the plunger rear section, the solid matters are effectively prevented from being jammed in the annular clearance between the plunger and the cylinder, due to a tight contact of the flap regions with the cylinder inner surface under resiliently deformed state, to ensure a particularly smooth operation of the plunger. In this context, the flap regions are preferably formed of a material with an appropriate hardness.

Furthermore, for a particular situation wherein the solid matters contained in the viscous liquid reach the axial slits in the plunger rear section, the size of each slit is made sufficiently greater than the size of the solid matter for allowing passage of the solid matters therethrough. Such slits also ensure a smooth operation of the plunger.

When the constant quantity of the viscous liquid has been discharged and the supply of the air pulse is subsequently stopped, a restoring force is applied to the plunger by the compressed viscous liquid. In this instance, the restoring force is relieved by the clearance between the inner wall of the cylinder and the intermediate section of the reduced diameter, and then drained through the axial slits in the rear section. Thus, it is possible to positively avoid an undesirable upward displacement or "push-back" of the plunger and a resultant suction of the air into the space below the rear section of the plunger, irrespectively of whether the viscous liquid has a relatively high compressibility, or whether it contains substantial amount of air bubbles.

Advantageously, the rear end of the plunger front section is formed with at least one recess in its outer surface, where the plunger is spaced from the cylinder inner wall leaving a gap therebetween, The gap is preferably designed to have a minimized size to allow a passage of the solid matters therethrough, so that it is not only possible to avoid inclination of the plunger axis relative to the cylinder axis, but also to ensure a smooth discharge of air and viscous liquid toward the plunger rear section.

BRIEF DESCRIPTION OF THE DRAWINGS

The present invention will now be explained in further detail hereinafter, by referring to a certain specific embodiment shown in the accompanying drawings, in which.

DETAILED DESCRIPTION OF THE PREFERRED EMBODIMENT

Figure 1A:
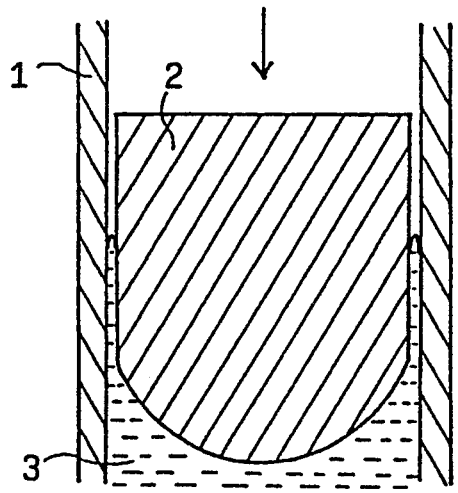
FIGS. 1A to 1D are schematic views showing various examples of conventional liquid dispenser with a cylinder and a plunger arranged inside of the cylinder, as discussed in some detail hereinabove.
Figure 1C:
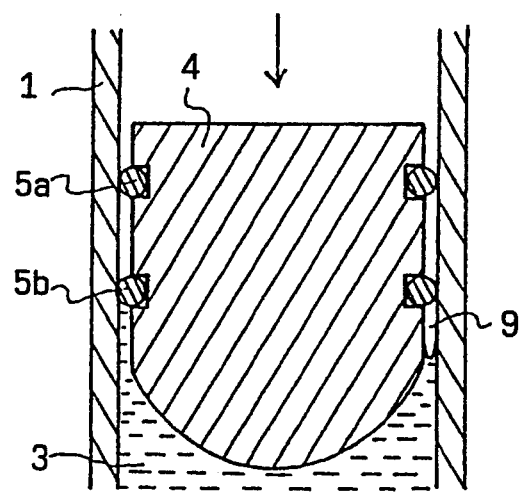
Figure 1B:
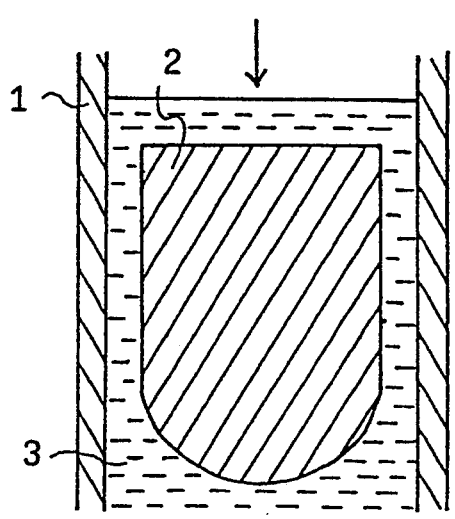
Figure 1D:
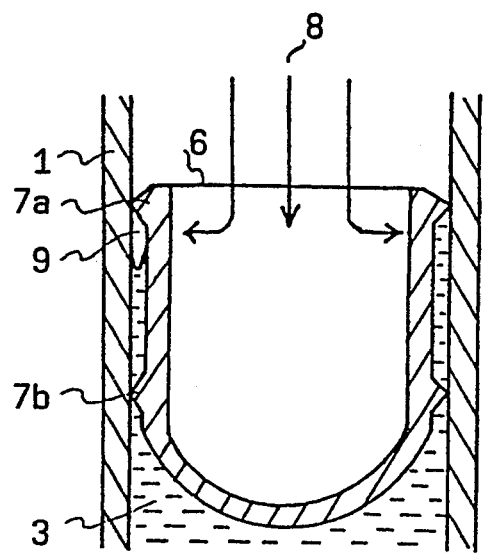
Figure 2A:
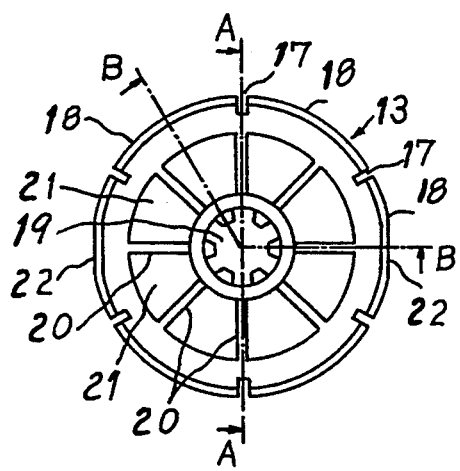
FIGS. 2A and 2B are top and bottom plan views, respectively, of the plunger for the liquid dispenser in accordance with a preferred embodiment of the present invention.

Referring now to FIGS. 2A, 2B, 3A and 3B, there is shown a plunger for a liquid dispenser in accordance with a preferred embodiment of the present invention. The plunger is designated as a whole by reference numeral 10 and includes three sections 11, 12, 13 which are axially aligned with each other, i.e., a front section 11 which is tapered so that its diameter increases rearwards, an intermediate section 12 connected to the rear side of the front section 11, and a rear section 13 connected to the rear side of the intermediate section 12.

Figure 3A:
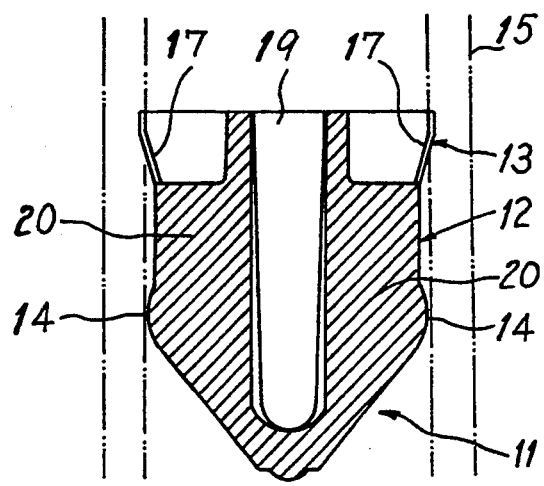
FIGS. 3A and 3B are longitudinal sectional views taken along lines A—A and B—B in FIG. 2A, respectively.
Figure 2B:
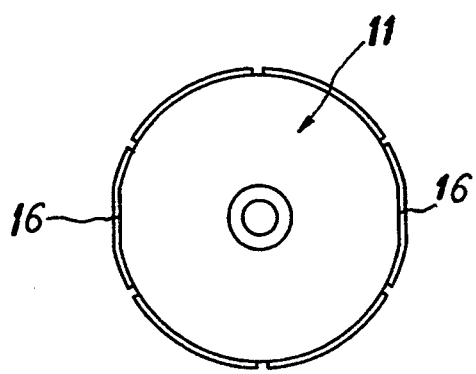
Figure 3B:
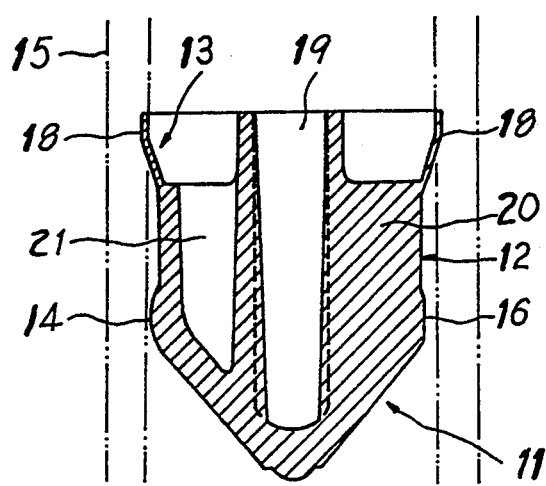

As particularly shown in FIGS. 3A and 3B, the front section 11 is of a substantially conical shape, and has a rear end 14 with an outer diameter which is slightly smaller than the inner diameter of the cylinder 15 as indicated by imaginary lines to such a degree that the front section 11 allows passage of not only air and viscous liquid, but also of solid matters which may be contained in the liquid, through the annular clearance between the cylinder inner wall and its rear end toward the intermediate section 12. The front section 11 in the illustrated embodiment is formed with two local recesses 16 where the plunger 10 is spaced from the inner wall of the cylinder 15. The recesses 16 are arranged at diametrically opposite locations. Formation of the recesses 16 ensures to even more positively discharge the viscous liquid and the like toward the intermediate section 12, thereby allowing minimization of the difference between the outer diameter of the rear end 14 and the inner diameter of the cylinder 15.

The intermediate section 12 situated between the front section 11 and the rear section 13 is of a drum-like configuration, and has a diameter which is somewhat reduced with reference to the rear end 14 of the front section 11.

The rear section 13 has a thin-walled structure, and may be of a cylindrical or slightly tapered conical shape. The rear section 13 has a plurality of axial slits 17, six in number in the illustrated embodiment, which are circumferentially equiangularly spaced from each other and define a plurality of flap regions 18 therebetween. The rear section 13 has a maximum outer diameter slightly greater than the inner diameter of the cylinder 15, at least in the rear end of the rear section to such a degree that the flap regions 18 are resiliently deformed radially inward to be tightly urged against the inner wall of the cylinder 15 in their deformed state. The flap regions 18 serve to prevent the viscous liquid from attaching to the inner wall of the cylinder 15, and also to prevent solid matters in the viscous liquid from being jammed between the flap regions 18 and the cylinder 15. Moreover, the resiliently deformable flap regions 18 are capable of sufficiently compensating for a possible fluctuation in the inner diameter of the cylinder 15 due to manufacturing tolerance. The axial slits 17, on the other hand, allows passage of part of the viscous liquid, and the restoring force of the liquid in its compressed state to be adequately relieved therethrough.

In the illustrated embodiment, the plunger 10 is formed with a center bore 19 which is opened in the rear end surface of the plunger 10 and extends axially toward the inside of the front section 11. The center bore 19 has a threaded inner surface which is engageable with a threaded shaft of a removing tool, not shown, for facilitating the removal of the plunger 10 out of the cylinder 15 whenever necessary. The center bore 19 may also be used to secure to the plunger 10 a sensor for monitoring the liquid level within the cylinder 15.

In the illustrated embodiment, furthermore, the material of the plunger 10 is partly removed leaving a plurality of ribs 20, eight in number, for example, so as to form hollow spaces 21 which extends from the intermediate section 11 toward the front section 11. Formation of these spaces 21 serves to improve the dimensional accuracy of the plunger 10 and to reduce the specific weight thereof.

The rear section 13 in the illustrated embodiment is formed with two local recesses 22 where the plunger 10 is spaced from the inner wall of the cylinder 15. The recesses 22 are arranged at diametrically opposite locations, and serve to upwardly discharge the viscous liquid and the like, essentially in the same manner as the recesses 16 in the front section 11, and ensure the restoring force of the liquid in its compressed state to be adequately relieved therethrough.

The function and operation of the plunger 10 constructed as above will be explained below.

It is assumed that a predetermined quantity of viscous liquid has previously been charged into the cylinder 15 which is composed of a transparent material. The plunger 10 is axially inserted into the cylinder 15 either manually or by using an appropriate tool. The plunger 10 can be smoothly inserted into the cylinder 15, without inclination of the plunger axis relative to the cylinder axis, due to the sliding contact of the rear end 14 of the front section 11 with the inner surface of the cylinder 15, in combination with the sliding contact of the flap regions 18 of the rear section 13 with the inner surface of the cylinder 15.

As the front section 11 is gradually dipped into the viscous liquid during the insertion of the plunger 10, a small part of the liquid and air enclosed in the liquid are displaced by the front section 11 and permitted to pass through the axial recesses 16 in the rear end 14 of the front section 11, toward the intermediate section 12. The displaced liquid and enclosed air are then introduced into a space around the intermediate section 12 and in front of the rear section 13. On this occasion, the air previously prevailing this space is gradually displaced therefrom, through the axial slits 17 in the rear section 13.

Normally, the displaced liquid and enclosed air introduced into the space around the intermediate section 12 are blocked by the rear section 13 due to a tight sliding contact of the flap regions 18 with the inner surface of the cylinder 15. However, depending upon the downward displacement of the plunger 10, a minor part of the liquid may enter into the axial slits 17 in the rear section 13 and attach to the inner surface of the cylinder 15. Nevertheless, the amount of the viscous liquid attached to the inner surface of the cylinder 15 is practically negligible, and the visual observation of the liquid level within the cylinder 15 from outside is not disturbed by the attached liquid.

During the insertion of the plunger 10 into the cylinder 15, even when solid matters contained in the viscous liquid enters the annular clearance between the cylinder 15 and the rear end 14 of the front section 11, the clearance has a dimension which permits passage of the solid matters therethrough. Thus, there is no risk of jamming of the solid matters in the annular clearance. Furthermore, even when such solid matters reach the rear section 13, due to the tight sliding contact of the relatively hard flap regions 18 of the rear section 13 with the inner surface of the cylinder 15, the solid matters cannot enter between the flap regions 18 and the cylinder 15. Here also, there is no risk of jamming of the solid matters between the flap regions 18 and the cylinder 15. Of course, some part of the solid matters may enter into the axial slits 17 in the rear section 13. However, the axial slits 17 are so dimensioned as to allow passage therethrough of the solid matters.

Each section 11, 12 and 13 of the plunger 10 achieves the same functions also during the discharge operation. To perform the discharge operation, a pressurized air pulse train is applied to the plunger 10, and the air pressure is transmitted to the viscous liquid mainly through the plunger 10. By this, the viscous liquid is urged downwards and discharged from the needle (not shown) which is secured to the front end of the cylinder 15. After a predetermined constant amount of the liquid has been discharged from the needle, the application of the pressurized air pulse train to the plunger 10 is stopped.

As discussed hereinbefore in connection with conventional liquid dispenser, when the application of the pressurized air pulse train to the plunger is stopped, the plunger is usually acted upon by a restoring force of the compressed liquid, irrespectively of whether the liquid has a relatively high compressibility or whether the liquid contains substantial amount of air bubbles. According to the present invention, however, a majority of the restoring force of the compressed liquid can be relieved into the space between the intermediate section 12 and the cylinder 15, through the annular clearance between the rear end 14 of the front section 11 and the cylinder 15, and further toward the upper side of the plunger 10 through the axial slits 17 in the rear section 13. Therefore, the plunger 10 of the present invention is not acted upon by a restoring force of such a magnitude as to induce an upward displacement or push-back of the plunger 10. This means that the air on the upper side of the plunger 10 is prevented from being sucked into the space between the intermediate section 12 and the cylinder 15, which would be otherwise inevitable as a result of the upward displacement of the plunger 10.

It will be appreciated from the foregoing description that the present invention provides an improved liquid dispenser which is capable of:

preventing the viscous liquid from being excessively admitted into the annular clearance between the cylinder and plunger, preventing the solid matters contained in the viscous liquid from being jammed into the annular clearance, preventing air from being sucked into the annular clearance from the top end region of the plunger, and ensuring the air pressure to be properly transmitted to the viscous liquid, thereby allowing a stable discharge of a constant quantity of the viscous liquid.

While the present invention has been explained with reference to a specific embodiment, it was presented by way of example only, and various modifications and alterations are possible without departing from the scope of the invention as defined in the appended claims.

What is claimed is:

1. A liquid dispenser for a viscous liquid, including a hollow cylinder having a predetermined inner diameter, and a plunger which is axially slidably accommodated within said cylinder, wherein said plunger comprises:

a front section which is tapered to a front end from a rear end, said rear end having an outer diameter smaller than the inner diameter of the cylinder;

an intermediate drum-shaped section having an outer diameter smaller than the outer diameter of the rear end of the front section;

a rear thin wall section having a maximum outer diameter greater than the inner diameter of the cylinder and having a plurality of axial slits spaced in a circumferential direction to define a plurality of flaps which are resiliently deformable radially inwards, and a center bore extending axially from a rear end surface of the plunger into the front section and having a threaded inner surface engageable with a tool for removing the plunger out of the cylinder.

2. The liquid dispenser as set forth in claim 1, wherein said rear end of the front section of the plunger has at least one axial recess wherein the plunger is spaced from the cylinder inner wall by such an amount as to allow passage therethrough of solid matters contained in the viscous liquid, toward said intermediate section.

3. The liquid dispenser as set forth in claim 2, wherein a plurality of axial recesses are formed for said front section, which are spaced from each other in circumferential direction of the plunger.

4. The liquid dispenser as set forth in claim 1, wherein said plunger is thin-walled in its rear section.

5. The liquid dispenser as set forth in claim 1, wherein said axial slits of the plunger are so dimensioned as to allow passage therethrough of solid matters contained in the viscous liquid.

6. The liquid dispenser as set forth in claim 1, wherein said rear section of the plunger has at least one axial recess in the area where the plunger is spaced from the cylinder inner wall.

7. The liquid dispenser as set forth in claim 6, wherein a plurality of axial recesses are formed in said rear section, said axial recesses being spaced from each other in circumferential direction of the plunger.

* * * * *